United States Patent [19]

Matsumoto

[11] Patent Number: 5,086,237
[45] Date of Patent: Feb. 4, 1992

[54] RE-TRIGGERABLE MONOSTABLE MULTIVIBRATOR CAPABLE OF GENERATING A PREDETERMINED WIDTH OF PULSE WITH ADDITIONAL LOGIC GATE AND D FLIP-FLOP WITH RESET

[75] Inventor: Kouji Matsumoto, Tokyo, Japan
[73] Assignee: NEC Corporation, Tokyo, Japan
[21] Appl. No.: 390,592
[22] Filed: Aug. 7, 1989

[30] Foreign Application Priority Data

Aug. 6, 1988 [JP] Japan .................. 63-196476

[51] Int. Cl.⁵ ............................... H03K 3/284
[52] U.S. Cl. ..................... 307/273; 307/265; 328/207
[58] Field of Search ............ 307/273, 608, 265, 266, 307/267, 228, 360, 261, 269; 328/207

[56] References Cited

U.S. PATENT DOCUMENTS 4,051,387  9/1977  Black ................... 307/273
4,965,465  10/1990  Denda ................... 307/273

Primary Examiner—Stanley D. Miller
Assistant Examiner—Sinh N. Tran
Attorney, Agent, or Firm—Helcott & Karas

[57] ABSTRACT

A monostable multivibrator comprises an input circuit receiving an trigger signal for generating an instantaneous pulse, a timing generation circuit receiving the instantaneous pulse for generating a timing defining signal after a predetermined time, and an output circuit for generating a output pulse starting in response to the instantaneous pulse and terminating at the timing defining signal. The timing generation circuit includes a time constant circuit including at least a capacitor, an OR gate having a first input connected to receive the output signal of the output circuit, a first logic circuit operating to discharge the capacitor when an output of the OR gate is in a first level and to charge the capacitor when the output of the OR gate is in a second level opposite to the first level, a second logic circuit for generating the timing defining signal when the potential of the capacitor reaches a first predetermined reference voltage, a third logic circuit for generating a reset signal when the potential of the capacitor is higher than a second predetermined reference voltage which is higher than the first predetermined reference voltage, and a flipflop reset in response to the reset signal and driven in response to the instantaneous pulse. An output of the flipflop is connected to a second input of the OR gate. When the reset signal is not active, if the instantaneous pulse is applied to the flipflop, the output of the flipflop is brought to the first level, so as to cause the first logic circuit to forcibly discharge the capacitor of the time constant circuit. Thereafter when the reset signal becomes active, the output of the flipflop is brought to the second level, so as to cause the first logic circuit to forcibly charge the capacitor of the time constant.

6 Claims, 8 Drawing Sheets

5,086,237

RE-TRIGGERABLE MONOSTABLE MULTIVIBRATOR CAPABLE OF GENERATING A PREDETERMINED WIDTH OF PULSE WITH ADDITIONAL LOGIC GATE AND D FLIP-FLOP WITH RESET

BACKGROUND OF THE INVENTION

1. Field of the Invention

The present invention relates to a monostable multivibrator circuit, and more specifically to a re-triggerable monostable multivibrator including a time constant circuit having at least a capacitor and for generating a predetermined width of pulse.

2. Description of Related Art

Referring to FIG. 1, there is shown one typical conventional timing generation circuit which forms an essential part of a monostable multivibrator. The shown timing generation circuit includes a first emitter coupled differential logic circuit ECL1, which comprises a transistor $Q_1$ having a base connected to an input IN and a collector connected to a ground line GND, another transistor $Q_2$ having a base connected to receive a reference voltage $V_{ref}$ and a collector connected through a resistor $R_1$ to the ground line GND, and a constant current source $I_{cs1}$ connected between commonly connected emitters of the transistors $Q_1$ and $Q_2$ and a negative voltage line $V_{EE}$. The collector of the transistor $Q_2$, which forms a non-inverted output of the emitter coupled differential logic circuit ECL1, is connected to a base of a third transistor $Q_3$, which has a collector connected to the ground line GND.

Furthermore, the shown timing generation circuit includes a time constant circuit composed of a capacitor C and a constant current source $I_0$ series-connected between the ground line GND and the negative voltage line $V_{EE}$. A connection node X between the capacitor C and the constant current source $I_0$ is connected to an emitter of the transistor $Q_3$. Thus, the transistor $Q_3$ forms an emitter follower.

The node X of the time constant circuit is connected to an input of a second emitter coupled differential logic circuit ECL21, which comprises a transistor $Q_4$ having a base connected to the node X and a collector connected through a resistor $R_2$ to the ground line GND, another transistor $Q_5$ having a base connected to receive a reference voltage $V_{ref1}$ slightly higher than a low level potential and a collector connected to the ground line GND, and a constant current source $I_{cs2}$ connected between commonly connected emitters of the transistors $Q_4$ and $Q_5$ and the negative voltage line $V_{EE}$. The collector of the transistor $Q_4$, which forms an inverted output of the second emitter coupled differential logic circuit ECL2, is connected to a base of a transistor $Q_6$, which has a collector connected to the ground line GND and an emitter connected through a resistor $R_3$ to the negative voltage line $V_{EE}$. The emitter of the transistor $Q_6$ is connected to an output OUT1. Thus, the transistor $Q_6$ forms an emitter follower.

The above mentioned timing generation circuit operates as follows:

As seen from the above, since the first emitter coupled differential logic circuit ECL1 outputs a signal in phase with an input signal, a signal applied to the input IN is a high level, the node X is brought a high level. At this time, a potential of the node X is substantially equal to a potential which is lower than a ground level of the ground line GND by a forward direction base-emitter voltage $V_{BE}$ of the transistor $Q_3$ when a constant current $I_0$ flows through the transistor $Q_3$.

On the other hand, the second emitter coupled differential logic circuit ECL2 generates an output signal in a reverse phase to an input signal applied to the second emitter coupled differential logic circuit ECL2, and therefore, a signal appearing at the node X is converted into an opposite phase signal. Namely, when the node X is at a high level, the output OUT1 is brought to a low level.

Now, assuming that the input signal on the input terminal IN is brought from the high level to a low level, a voltage drop V will occur across the resistor $R_1$ $\{V = R_1 \cdot I_{cs1}\}$, so that the emitter follower transistor $Q_3$ is cut off, with the result that the constant current source $I_0$ will start to charge the capacitor C.

Referring to FIG. 2, there is shown a timing chart illustrating an operation of the timing generation circuit shown in FIG. 1. A left half of FIG. 2 shows a condition in which the charging of the capacitor C is started as mentioned above and then the potential of the node X is gradually lowered at a constant rate which is determined by the time constant of the time constant circuit.

When the potential of the node X becomes lower than the first reference voltage $V_{ref1}$ which is applied as the reference potential for the second emitter coupled differential logic circuit ECL2, the output of this second emitter coupled differential logic circuit ECL2 is inverted from the low level to the high level.

Here, a time length $T_1$ starting from a transition of the input signal IN from the high level to the low level and terminating at a transition of the output signal OUT1 from the low level to the high level, can be expressed as follows:

First, the amount of electric charge Q stored in the capacitor C is expressed:

$$Q = C \cdot |V_{ref1} - V_{BE}|$$

Therefore, $$T_1 = \frac{Q}{I_o} = \frac{C \cdot |V_{ref1} - V_{BE}|}{I_o}$$

Furthermore, if the low level of the input signal IN is continuously maintained as it is, the potential of the node X is stabilized at the low level after a time length $T_2$ has been elapsed. The time length $T_2$ can be expressed as follows:

$$T_2 = \frac{CV}{I_o} = \frac{C \cdot R_1 \cdot I_{cs1}}{I_o}$$

Namely, the potential of the node X becomes at a level which is lower than the ground level by $R_1 \cdot I_{cs1} + V_{BE}$. If the input signal is returned to the high level before the time $T_1$ elapses, the output signal OUT1 will not change its level, and therefore, is maintained at the low level.

On the other hand, when the input signal IN changes from the low level to the high level, the electric charge stored in the capacitor C will discharge through the transistor $Q_3$ at a time length which is considerably shorter than the charging time.

In the above mentioned timing generation circuit for the monostable multivibrator, when the input signal IN is brought from the high level to the low level, the transistor $Q_3$ is cut off, so that the charging of the capacitor C is started. In some case, however, the input signal is brought from high level to the low level in the course of the discharging of the capacitor C, namely, in the process in which the potential of the node X is changing from the low level toward the high level. In this case, the charging of the capacitor C is restarted before the electric charge of the capacitor C has been completely discharged.

Referring to a right hand of FIG. 2, there is illustrated the above mentioned situation. In this case, since the discharge of the capacitor C is not sufficient, the time T from the moment the input signal changes from the high level to the low level to the moment the output signal changes from the low level to the high level, is smaller than the above mentioned time length $T_1$. In other words, it is not possible to ensure the predetermined response time $T_1$ after the leading edge of the input signal IN until the tail edge of the output signal OUT1.

Referring to FIG. 3, there is shown a conventional monostable multivibrator which incorporates therein the timing generation circuit shown in FIG. 1. In FIG. 3, the timing generation circuit shown in FIG. 1 is given the reference numeral 1.

The monostable multivibrator shown in FIG. 3 includes a D-type flipflop 2, which has a data input D connected to a high level "H" and a clock input CK connected to a clock terminal CLOCK. A Q output of the flipflop 2 is connected to a node A, which is connected to one input of an OR gate 5. An output of the OR gate 5 is connected to the input IN of the timing generation circuit 1. The node A is also connected to an input of another OR gate 6, which has an output connected to a reset input RESET of the flipflop 2. The other input of the OR gate 6 is connected to a clear terminal CLEAR. A $\overline{Q}$ output of the flipflop 2 is connected to one input of a NOR gate 7, which has the other input connected to the clear terminal CLEAR.

The output OUT1 of the timing generation circuit 1 is connected to a clock input CK of another D-type flipflop 8. This D-type flipflop 8 has a data input D connected to a low level "L", and a Q output connected to an output terminal OUT of the multivibrator. The D-type flipflop 8 also has a set input SET connected to an output of the NOR gate 7, and a reset input RESET connected to the clear terminal CLEAR. In addition, a $\overline{Q}$ output of the flipflop 8 is connected to the other input of the OR gate 5.

Now, an operation of the monostable multivibrator shown in FIG. 3 will be described with reference to FIG. 4.

First, a high level signal is applied to the clear terminal CLEAR so as to initialize the circuit. As a result, the following initialized condition is established:
Node A = low level
Output terminal OUT = low level
Input IN of the timing generation = high level
Node X of the timing generation = high level
Output OUT1 of the timing generation = low level After the clear signal is cancelled or brought to a low level, a trigger signal is applied to the clock input CLOCK. With the change of the signal inputted to the clock terminal CLOCK from the low level to the high level, the Q output of the flipflop 2 will change from the low level to the high level and further immediately change to the low level, since the Q output of the flipflop 2 is fed back to the reset terminal RESET of the flipflop 2 through the OR gate 6, so that the Q output of the flipflop 2 generates a narrow width of pulse as shown in FIG. 4. Simultaneously, the $\overline{Q}$ output of the flipflop 2 generates a negative-going narrow pulse, which is inputted through the NOR gage 7 to the set input SET of the flipflop 8, so that the output terminal OUT of the multivibrator is brought to a high level, and on the other hand, the input IN of the timing generation circuit 1 is brought to a low level. From this moment, the constant current source $I_0$ starts the charging of the capacitor C in the time constant circuit.

The potential of the node X will drop with time, and when the potential of the node X reaches to the reference voltage $V_{ref1}$, the output OUT1 of the timing generation circuit 1 is changed from the low level to the high level, so that the flipflop 8 is caused to change its state. Specifically, the output terminal OUT is brought to a low level, and the input IN of the timing generation circuit 1 is brought to the high level, so that the capacitor C of the time constant circuit will start its discharge.

A left half of the timing chart shown in FIG. 4 illustrates the above mentioned operation. The time length $T_1$ of the high level of the output pulse appearing on the terminal OUT is determined by the time constant of the constant current source $I_0$ and the capacitor C.

A right half of FIG. 4 illustrates a situation in which a trigger signal is applied again to the clock terminal CLOCK in the way of the discharging of the capacitor C, namely before the time period $T_1$ for outputting the high level signal to the output terminal OUT elapses. In the monostable multivibrator shown in FIG. 3, the narrow width positive-going pulse generated at the node A by the re-trigger signal will function to discharge the capacitor C. In the case that the capacitor C has a relative large capacitance, the charging is restarted before the discharge of the capacitor C has been completed. As a result, the time length T from the application of the re-trigger signal until the output terminal OUT is changed from the high level to the low level is smaller than the predetermined time $T_1$, since the charge of the capacitor C has not been completely discharged at once.

SUMMARY OF THE INVENTION

Accordingly, it is an object of the present invention to provide a monostable multivibrator circuit which has overcome the above mentioned defect of the conventional one.

Another object of the present invention is to provide a re-triggerable monostable multivibrator having a time constant circuit including at least a capacitor and capable of generating a predetermined width of pulse in response to a re-trigger signal.

The above and other objects of the present invention are achieved in accordance with the present invention by a monostable multivibrator comprising an input circuit receiving a trigger signal for generating an instantaneous pulse, a timing generation circuit receiving the instantaneous pulse for generating a timing defining signal after a predetermined time, and an output circuit receiving the instantaneous pulse and the timing defining signal for generating an output pulse starting in response to the instantaneous pulse and terminating at the timing defining signal, the timing generation circuit including a time constant circuit including at least a capacitor, an OR gate having a first input connected to receive the output signal of the output circuit, a first logic circuit having an input connected to an output of the OR gate and operating to discharge the capacitor of the time constant circuit when the output of the OR gate is in a first level and to charge the capacitor of the time constant circuit when the output of the OR gate is in a second level opposite to the first level, a second logic circuit connected to receive a potential of the capacitor for generating the timing defining signal when the potential of the capacitor reaches a first predetermined reference voltage, a third logic circuit connected to receive a potential of the capacitor for generating a reset signal when the potential of the capacitor is higher than a second predetermined reference voltage which is higher than the first predetermined reference voltage, and a flipflop reset in response to the reset signal and driven in response to the instantaneous pulse, an output of the flipflop being connected to a second input of the OR gate, so that when the reset signal is not active, if the instantaneous pulse is applied to the flipflop, the output of the flipflop is brought to the first level, so as to cause the first logic circuit to forcibly discharge the capacitor of the time constant circuit, and thereafter, when the reset signal becomes active, the output of the flipflop is brought to the second level, so as to cause the first logic circuit to forcibly charge the capacitor of the time constant.

The above and other objects, features and advantages of the present invention will be apparent from the following description of preferred embodiments of the invention with reference to the accompanying drawings.

DESCRIPTION OF THE PREFERRED EMBODIMENTS

Figure 5:
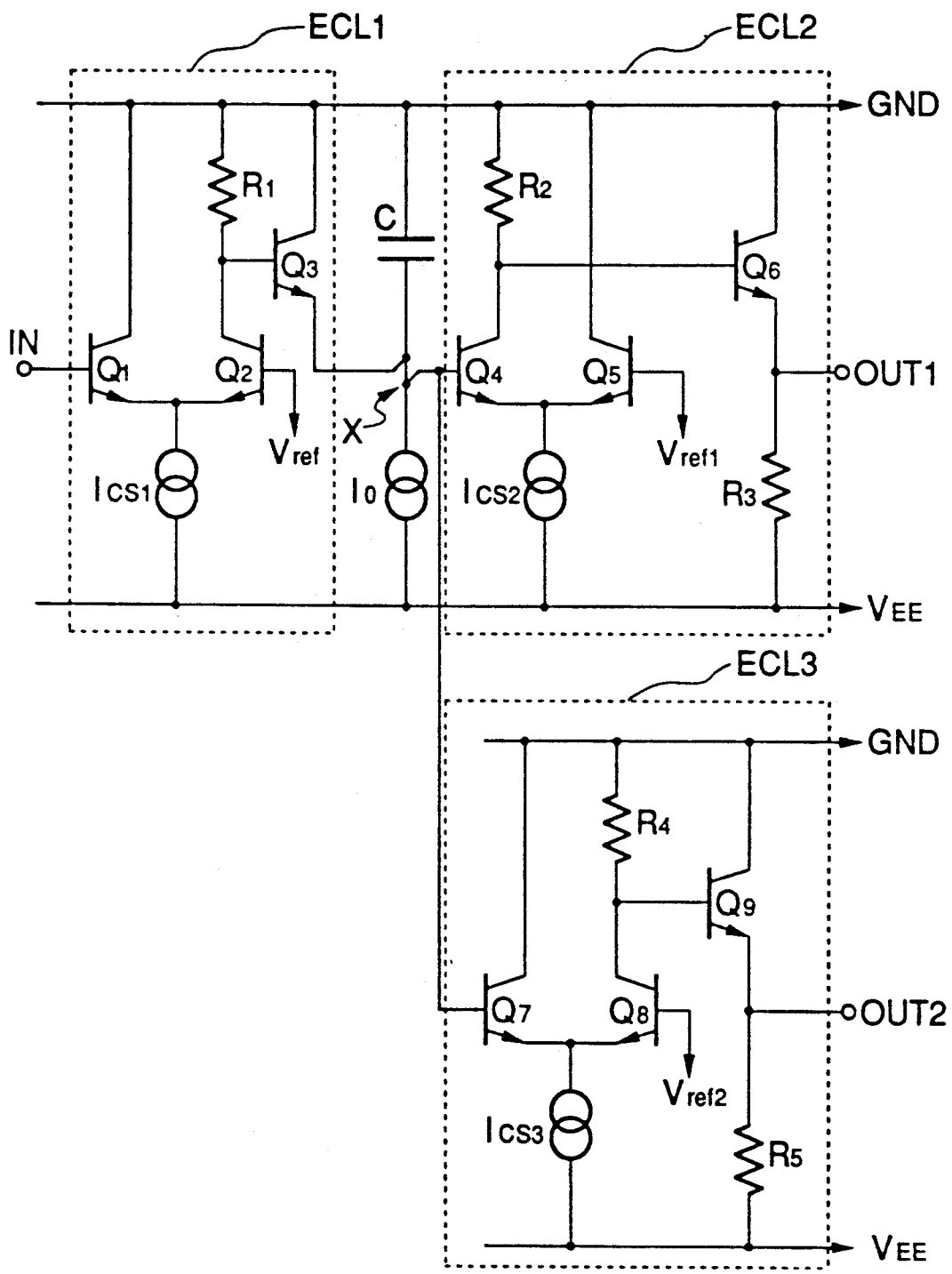
FIG. 5 is a circuit diagram of one embodiment of the timing generation circuit which is in accordance with the present invention and which forms an essential part of a monostable multivibrator.

Referring to FIG. 5, there is shown a circuit diagram of one embodiment of the timing generation circuit which is in accordance with the present invention and which forms an essential part of a monostable multivibrator. In FIG. 5, circuit elements corresponding to those shown in FIG. 1 are given the same reference numerals, and description thereof will be omitted.

Figure 1:
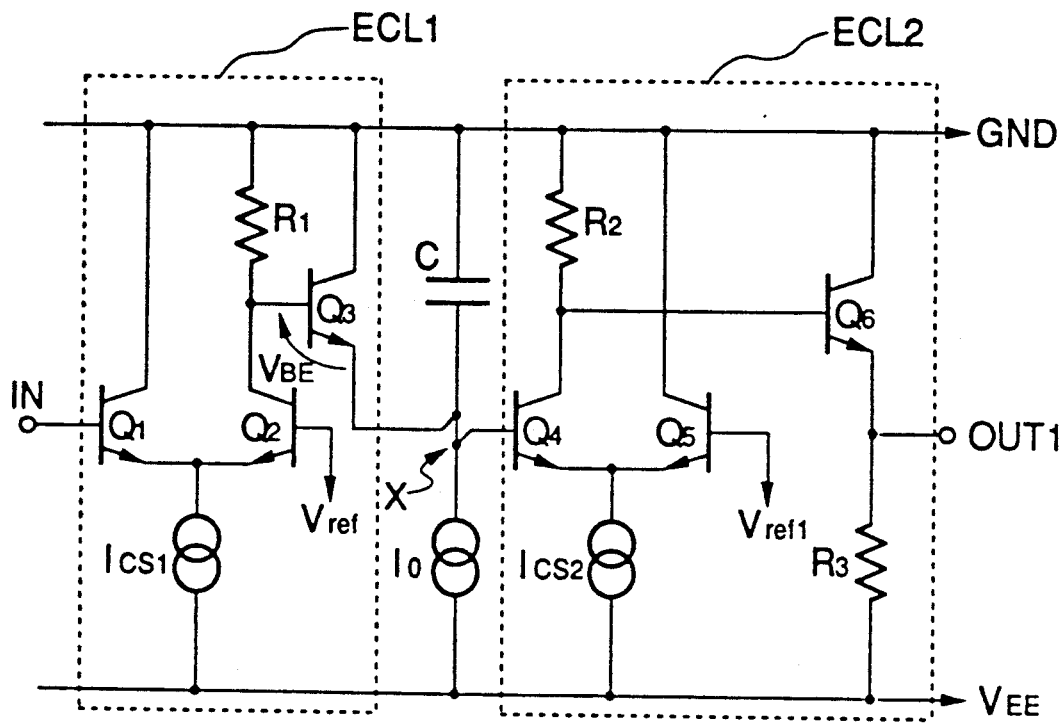
FIG. 1 is a circuit diagram of one typical conventional timing generation circuit which forms an essential part of a monostable multivibrator.
Figure 2:
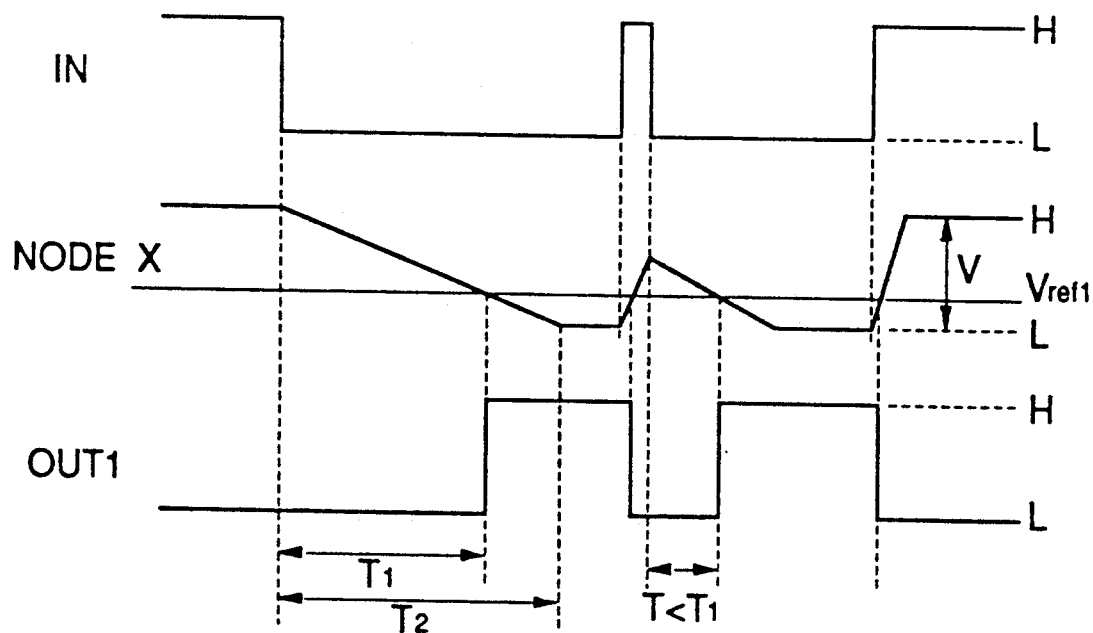
FIG. 2 is a timing chart illustrating an operation of the timing generation circuit shown in FIG. 1.

As seen from comparison between FIGS. 1 and 5, the timing generation circuit shown in FIG. 5 includes a third emitter coupled differential logic ECL3 in addition to the conventional timing generation circuit shown in FIG. 1. The third emitter coupled differential logic circuit ECL3 comprises a transistor $Q_7$ having a base connected to the node X and a collector connected to the ground line GND, another transistor $Q_8$ having a base connected to receive a reference voltage $V_{ref2}$ slightly lower than the high level potential and a collector connected through a resistor $R_4$ to the ground line GND, and a constant current source $I_{cs3}$ connected between commonly connected emitters of the transistors $Q_7$ and $Q_8$ and the negative voltage line $V_{EE}$. The collector of the transistor $Q_8$, which forms a non-inverted output of the third emitter coupled differential logic circuit ECL3, is connected to a base of a transistor $Q_9$, which has a collector connected to the ground line GND and an emitter connected through a resistor $R_5$ to the negative voltage line $V_{EE}$. The emitter of the transistor $Q_9$ is connected to an output OUT2. Thus, the transistor $Q_9$ forms an emitter follower. Accordingly, the output OUT2 generates a signal in phase to an input of the third emitter coupled differential logic circuit ECL3.

Figure 6:
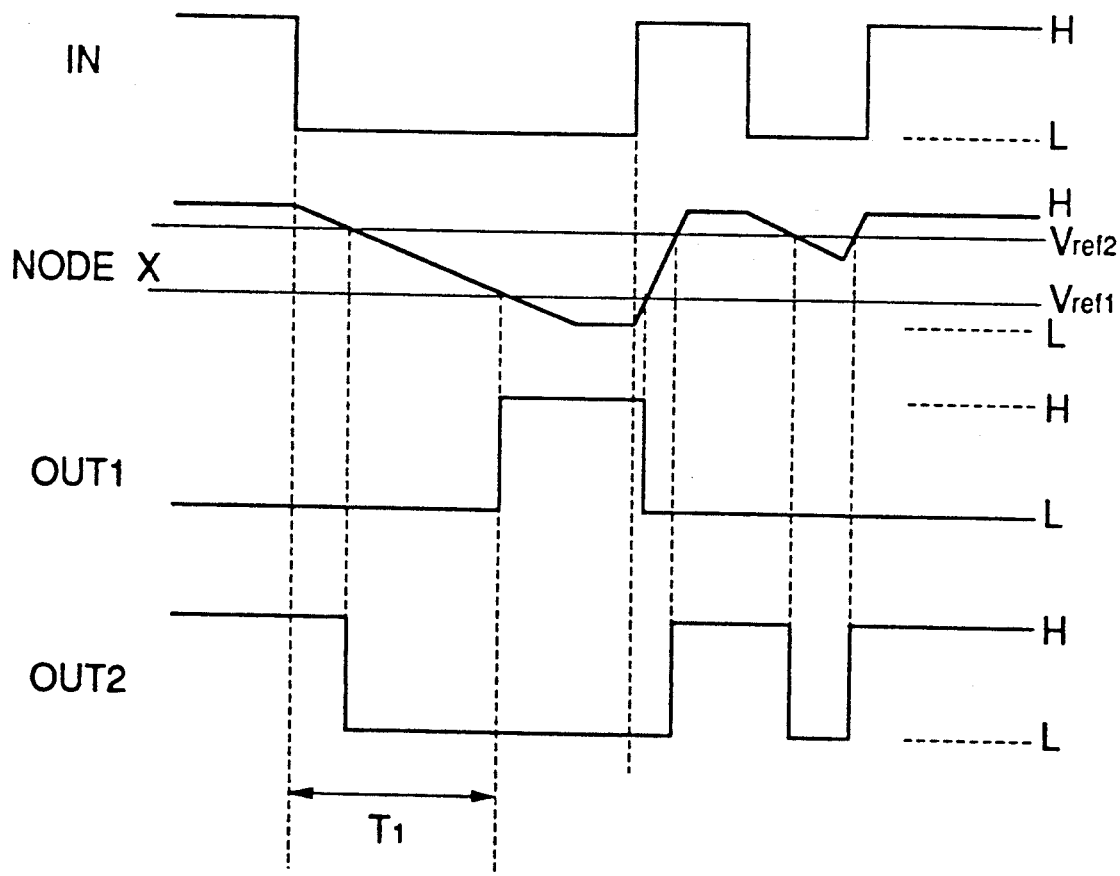
FIG. 6 is a timing chart illustrating an operation of the timing generation circuit shown in FIG. 5.

Now, an operation of the above mentioned timing generation circuit when a re-trigger signal is inputted, will be explained with reference to a timing chart of FIG. 6 illustrating the operation of the circuit shown in FIG. 5.

Respective conditions and mutual relation of the level or potential on the input IN, the node X and the output OUT1 are the same as those shown in FIG. 1. In the meanwhile, the third emitter coupled logic circuit ECL3 operates in a differential mode based on the second reference voltage $V_{ref2}$ and generates at the output OUT2 an acknowledge or mask signal for controlling the reception of a re-trigger signal.

As seen from FIG. 6, the signal appearing on the output OUT2 is never brought to a high level unless the potential of the node X becomes higher than the second referecen voltage $V_{ref2}$ which is sufficiently higher than the first reference voltage $V_{ref1}$, namely unless the charge stored in the capacitor C is sufficiently discharged. Accordingly, the signal on the output OUT2 can be used as the mask signal which inhibits the reception of the trigger signal until the capacitor C is sufficiently discharged.

Figure 3:
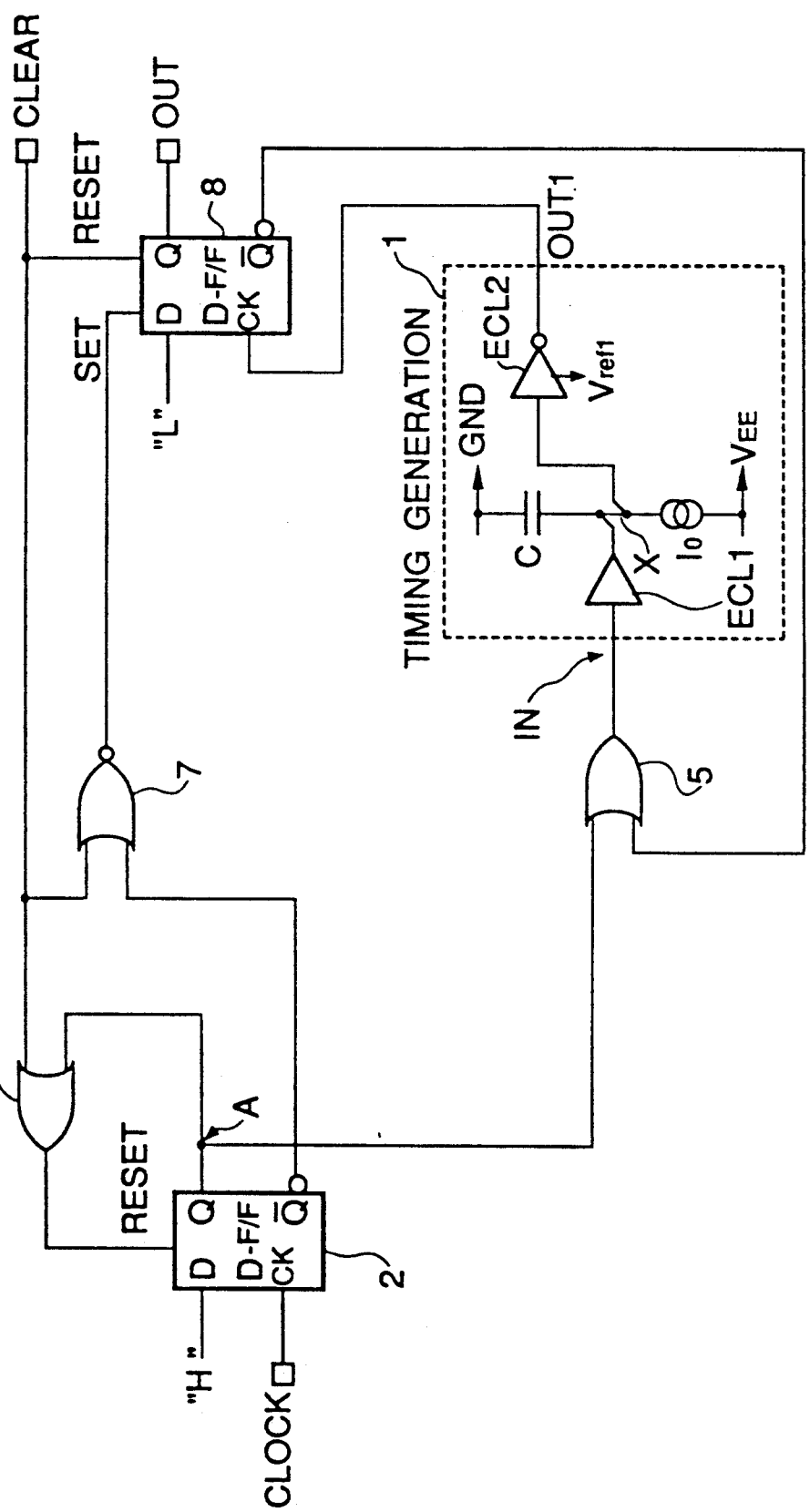
FIG. 3 is a logic diagram of one typical conventional monostable multivibrator incorporating therein the timing generation circuit shown in FIG. 1.
Figure 4:
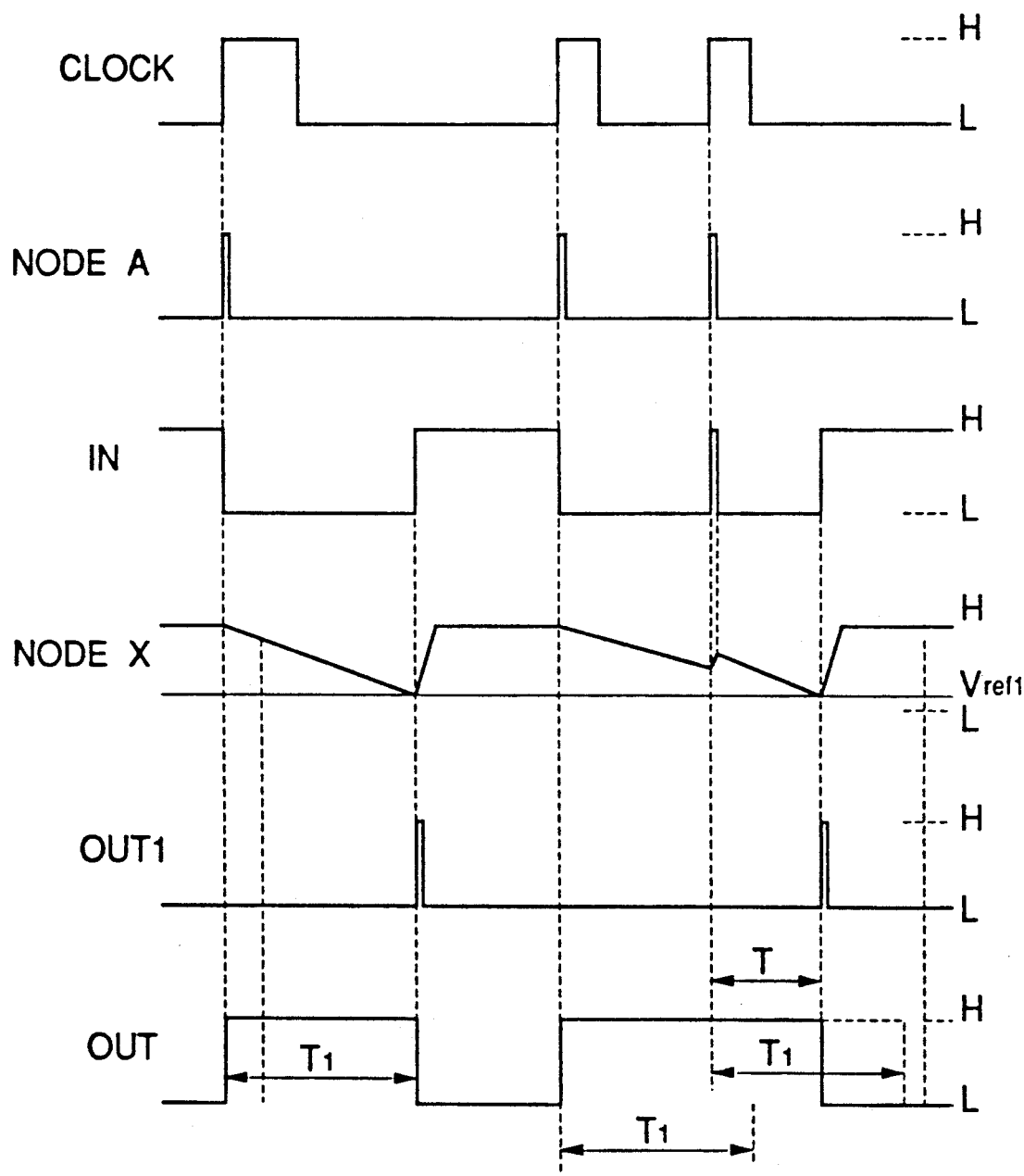
FIG. 4 is a timing chart illustrating an operation of the monostable multivibrator shown in FIG. 3.
Figure 7:
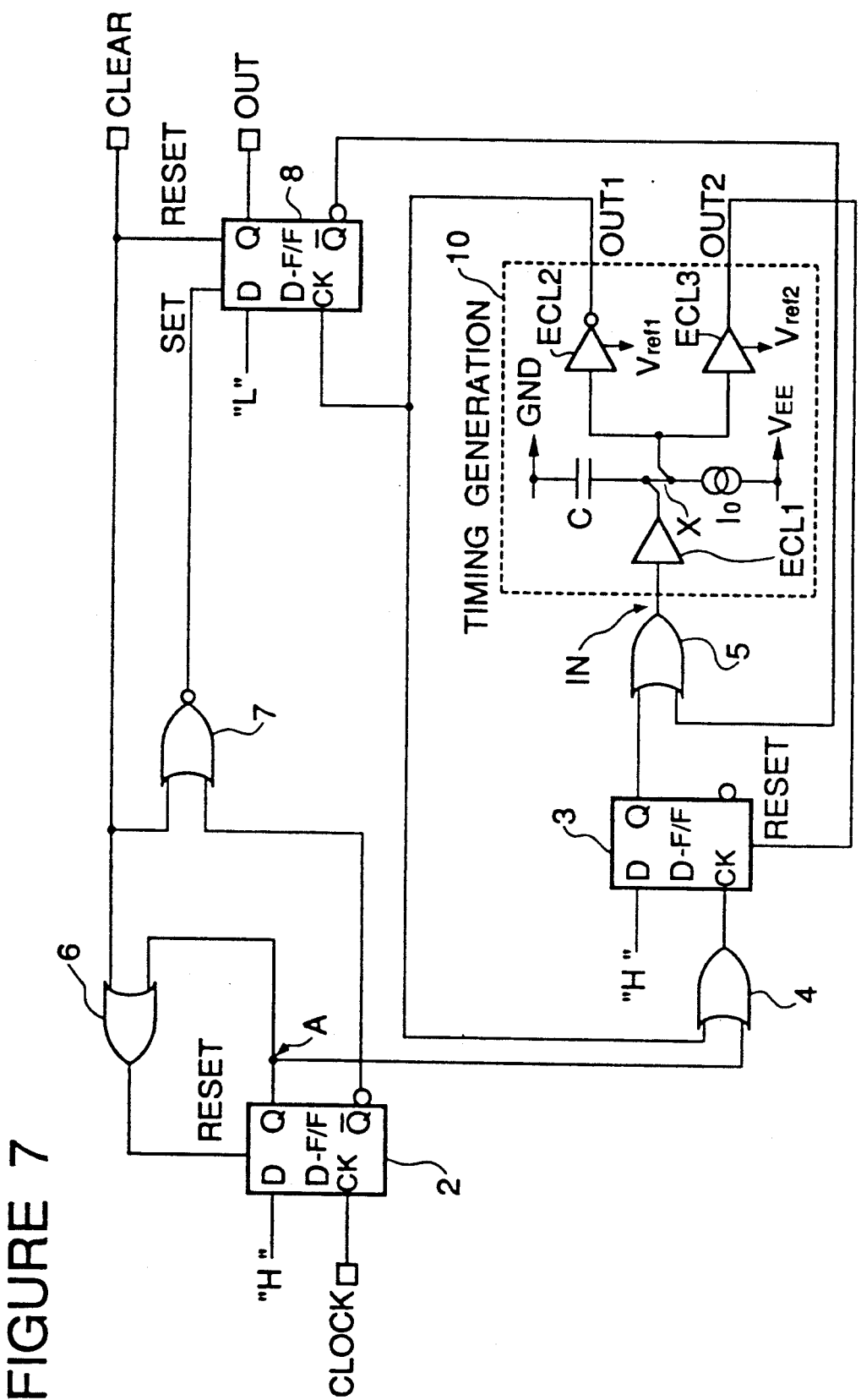
FIG. 7 is a logic diagram of one embodiment of the monostable multivibrator in accordance with the present invention and incorporating therein the timing generation circuit shown in FIG. 5.
Figure 8:
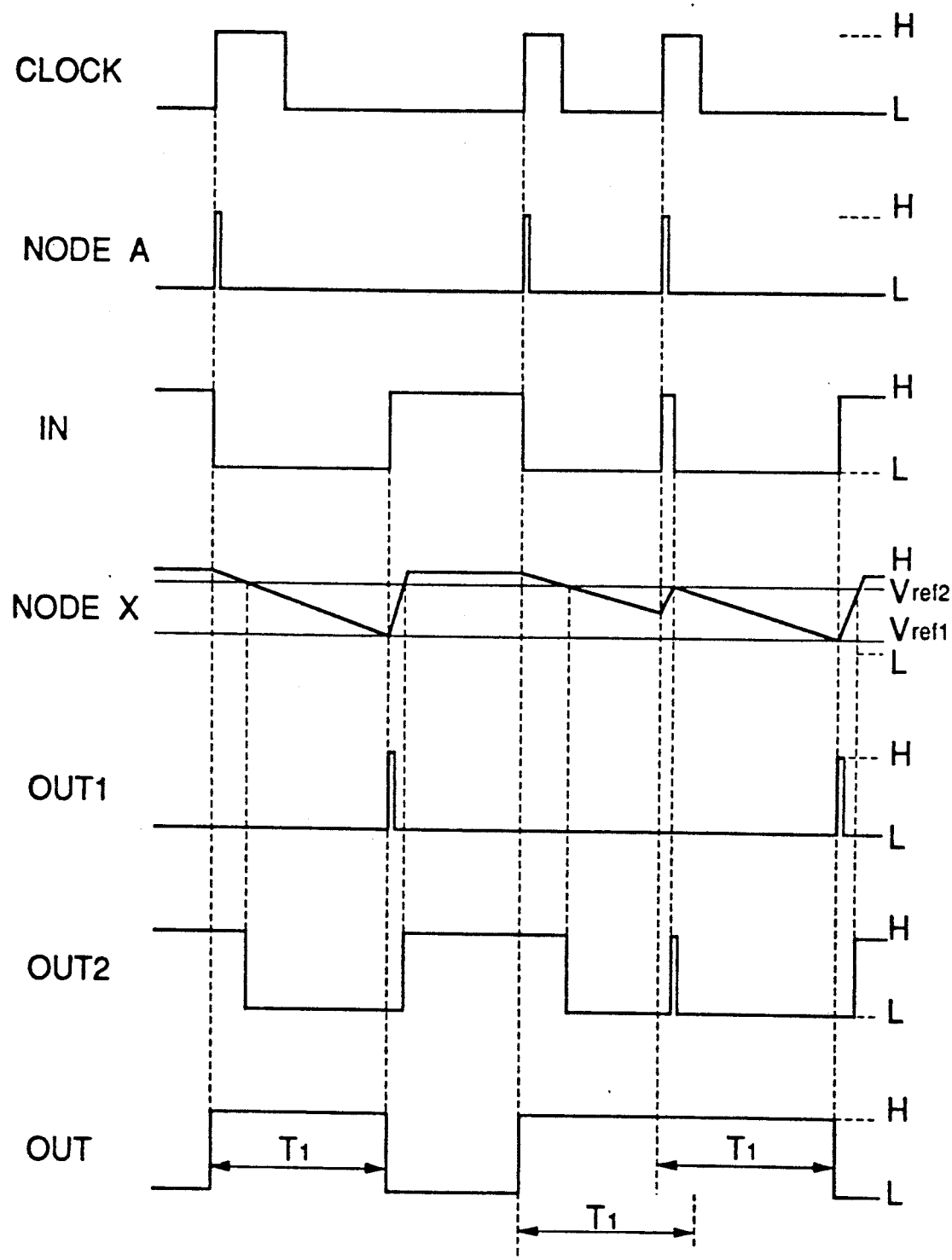
FIG. 8 is a timing chart illustrating an operation of the monostable multivibrator shown in FIG. 7.

Turning to FIG. 7, there is shown a logic diagram of one embodiment of the monostable multivibrator in accordance with the present invention and incorporating therein the timing generation circuit shown in FIG. 5. In FIG. 8, circuit elements corresponding to those shown in FIG. 3 are given the same reference numerals, and description thereof will be omitted. In addition, the timing generation circuit shown in FIG. 5 is given the reference numeral 10.

In the monostable multivibrator shown in FIG. 7, the node A is connected to one input of an OR gate 4, which has another input connected to the output OUT1 of the timing generation circuit 10. An output of the OR gate 4 is connected to a clock input CK of a D-type flipflop 3. This flipflop 3 has a data input D connected to a high level "H" and a Q output connected to one input of the OR gate 5. A reset input RESET of the flipflop 3 is connected to the output OUT2 of the timing generation circuit 10.

Now, an operation of the multivibrator shown in FIG. 7 will be described with reference to the timing chart of FIG. 8 illustrating the operation of the multivibrator shown in FIG. 7.

First, a high level signal is applied to the clear terminal CLEAR so as to initialize the multivibrator circuit. As a result, the following initialized condition is established:
Node A = low level
Output terminal OUT = low level
Input IN of the timing generation = high level
Node X of the timing generation = high level
Output OUT1 of the timing generation = low level
Output OUT2 of the timing generation = high level
Q output of flipflop 3 = low level After the clear signal is cancelled or brought to a low level, a trigger signal is applied to the clock input CLOCK. With the change of the signal inputted to the clock terminal CLOCK from the low level to the high level, the Q output of the flipflop 2 will change from the low level to the high level and further immediately return to the low level, since the Q output of the flipflop 2 is fed back to the reset terminal RESET of the flipflop 2 through the OR gate 6, so that the Q output of the flipflop 2 generates a narrow width of pulse at the mode A as shown in FIG. 8. Simultaneously, the $\overline{Q}$ output of the flipflop 2 generates a negative-going narrow pulse, which is inputted through the NOR gage 7 to the set input SET of the flipflop 8, so that the output terminal OUT of the multivibrator is brought to a high level, and on the other hand, the input IN of the timing generation circuit 10 is brought to a low level.

From this moment, the constant current source $I_0$ starts the charging of the capacitor C in the time constant circuit. The potential of the node X will drop with time, and when the potential of the node X reaches to the first reference voltage $V_{ref1}$, the output OUT1 of the timing generation circuit 10 is changed from the low level to the high level, so that the flipflop 8 is caused to change its state. Specifically, the output terminal OUT is brought to a low level, and on the other hand, since the flipflop 3 is set by the output OUT1 of the timing generation circuit 10, the input IN of the timing generation circuit 10 is brought to the high level, so that the capacitor C of the time constant circuit will start its discharge.

A left half of the timing chart shown in FIG. 8 illustrates the above mentioned operation. The time length $T_1$ of the high level of the output pulse appearing on the terminal OUT is determined by the time constant of the constant current source $I_0$ and the capacitor C.

A right half of FIG. 8 illustrates a situation in which a trigger signal is applied again to the clock terminal CLOCK in the way of the discharging of the capacitor C, namely before the time period $T_1$ for outputting the high level signal to the output terminal OUT elapses.

In the monostable multivibrator shown in FIG. 7, the narrow width positive-going pulse generated at the node A by the re-trigger signal will function to clock the flipflop 3. Namely, the input IN of the timing generation circuit 10 is brought from the low level to the high level. As a result, the capacitor C is started to discharge, and therefore, the potential of the node X will gradually elevated. When the potential of the node X reaches the second reference voltage $V_{ref2}$, the output OUT2 of the timing generation circuit 10 is brought from the low level to the high level. Accordingly, until the high level signal outputted from the output OUT2 of the timing generation circuit 10 is supplied to the reset input RESET of the flipflop 3, namely, until the discharge of the capacitor C is substantially completed, the input IN of the timing generation circuit 10 is maintained at the high level.

With the flipflop 3 reset by the high level signal from the output OUT2 of the timing generation circuit 10, the input IN of the timing generation circuit 10 is brought to the low level, so that the capacitor C is charged, again. In this case, since the capacitor C has been sufficiently discharged at once, a time starting from the leading edge of the re-trigger signal and terminating at the tail edge of the output signal on the terminal OUT is substantially equal to the aforementioned predetermined time length $T_1$.

As mentioned above, the monostable multivibrator shown in FIG. 8 can operate, in the case that a re-trigger signal is applied, to generate at the output terminal OUT a signal having a predetermined high level period $T_1$ starting from a leading edge of the re-trigger signal.

Figure 9:
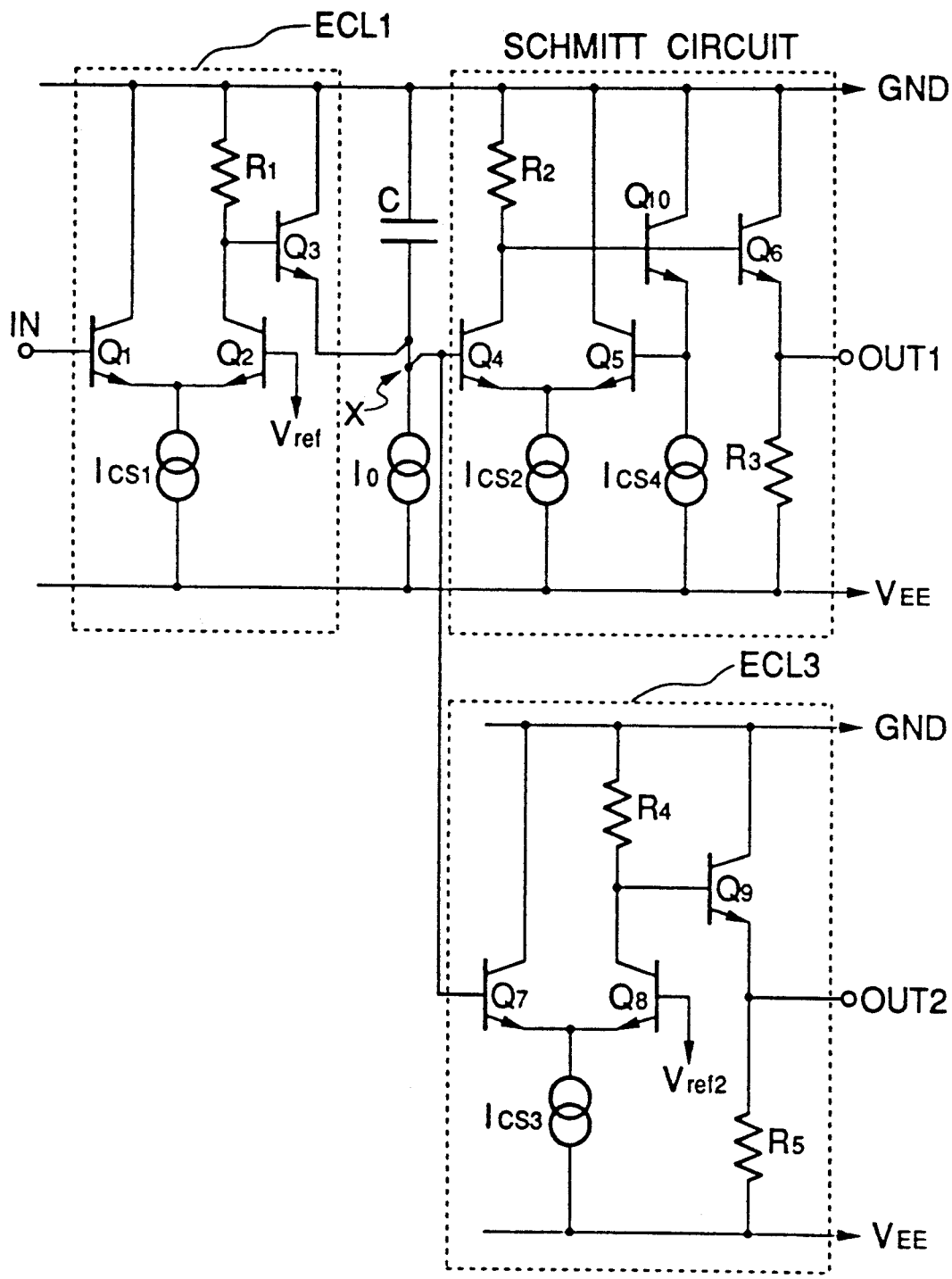
FIG. 9 is a circuit diagram similar to FIG. 5 but showing another embodiment of the timing generation circuit in accordance with the present invention.

Referring to FIG. 9, there is shown a modification of the embodiment of the timing generation circuit shown in FIG. 5. In this modified embodiment, a Schmitt circuit, which internally includes a reference voltage source, is used in place of one of the emitter coupled differential logic circuits which receive different reference voltages, respectively.

Specifically, the modified embodiment shown in FIG. 9 comprises a Schmitt circuit in place of the second emitter coupled differential logic circuit ECL2. This Schmitt circuit is composed by adding a reference voltage source to the second emitter coupled differential logic circuit ECL2 including the resistor $R_2$, the transistors $Q_4$ and $Q_5$ and the constant current source $I_{cs2}$. This reference voltage source includes a transistor $Q_{10}$ having a base connected to the collector of the transistor $Q_4$ and a collector connected to the ground GND, and a constant current source $I_{cs4}$ connected between an emitte of the transistor $Q_{10}$ and the negative voltage $V_{EE}$. The emitter of the transistor $Q_{10}$ is connected to a base of the transistor $Q_5$.

With use of the Schmitt circuit, the timing generation circuit can have an increased noise margine.

As will be apparent from the above description of the embodiments with reference to the accompanying drawings, the timing generation circuit used in the monostable multivibrator in accordance with the present invention includes the time constant circuit having at least a capacitor and two differential circuits operating on the basis of different reference voltages, respectively. One of the two differential circuits can detect the change of the capacitor potential to a predetermined reference voltage which defines an unstable state period of the monostable multivibrator, and the other differential circuit is capable of detecting a substantially complete discharge of the capacitor of the time constant circuit. In addition, the monostable multivibrator in accordance with the present invention is configured to inhibit the charging of the capacitor of the time constant circuit unless the capacitor of the time constant circuit has been substantially completely discharged at once. Therefore, even if a re-trigger signal is inputted at any timing, since the capacitor of the time constant circuit is substantially completely discharged at once without exception, the monostable multivibrator can generate an output signal having a predetermined continuation period starting at the leading edge of the re-trigger signal.

The invention has thus been shown and described with reference to the specific embodiments. However, it should be noted that the present invention is in no way limited to the details of the illustrated structures but changes and modifications may be made within the scope of the appended claims.

I claim:

1. A monostable multivibrator comprising an input circuit receiving a trigger signal for generating an instantaneous pulse, a timing generation circuit receiving the instantaneous pulse for generating a timing defining signal after a predetermined time, and an output circuit receiving the instantaneous pulse and the timing defining signal for generating an output pulse in response to the instantaneous pulse and terminating at the timing defining signal, the timing generation circuit including a time constant circuit including at least a capacitor, an OR gate having a first input connected to receive the output signal of the output circuit, a first logic circuit having an input connected to an output of the OR gate and operating to discharge the capacitor of the time constant circuit when the output of the OR gate is in a first level and to charge the capacitor of the time constant circuit when the output of the OR gate is in a second level opposite to the first level, a second logic circuit connected to receive a potential of the capacitor for generating the timing defining signal when the potential of the capacitor reaches a first predetermined reference voltage, a third logic circuit connected to receive a potential of the capacitor for generating a reset signal when the potential of the capacitor is higher than a second predetermined reference voltage which is higher than the first predetermined reference voltage, and a flipflop reset in response to the reset signal and driven in response to the instantaneous pulse, an output of the flipflop being connected to a second input of the OR gate, so that when the reset signal is not active, if the instantaneous pulse is applied to the flipflip, the output of the flipflop is brought to the first level, so as to cause the first logic circuit to forcibly discharge the capacitor of the time constant circuit, and thereafter, when the reset signal becomes active, the output of the flipflop is brought to the second level, so as to cause the first logic circuit to forcibly charge the capacitor of the time constant.

2. A monostable multivibrator claimed in claim 1 wherein the first logic circuit is composed of a first emitter coupled differential circuit having an input and for generating an output signal in phase with a signal inputted to the input thereof, and the second logic circuit is composed of a second emitter coupled differential circuit having an input connected to one end of the capacitor and for generating the timing defining signal in opposite phase with a signal inputted to the input thereof when the potential of the capacitor reaches a first predetermined reference voltage, and a third logic circuit composed of a third emitter coupled differential circuit having an input connected to the one end of the capacitor and for generating the reset signal in phase with a signal inputted to the input thereof when the potential of the capacitor is higher than a second predetermined reference voltage which is higher than the first predetermined reference voltage.

3. A monostable multivibrator claimed in claim 1 further including a clear terminal and wherein the flipflop is composed of a first D-type flipflop, and wherein the input circuit includes a second D-type flipflop which has a data input connected to a high level and a clock input connected to the input terminal, a Q output of the second D-type flipflop being connected through a second OR gate to a clock input of the first D-type flipflop, and a third OR gate having a first input connected to the Q output of the second D-type flipflop, a second input connected to the clear terminal and an output connected to a reset input of the second D-type flipflop.

4. A monostable multivibrator claimed in claim 3 wherein the output circuit includes a third D-type flipflop which has a data input connected to a low level and a clock input connected to receive the reset signal from the third logic circuit, the second D-type flipflop also having a Q output connected to the output terminal, a $\overline{Q}$ output connected to a reset input of the first D-type flipflop, and a reset input connected to the clear terminal, and a NOR gate having a first input connected to the $\overline{Q}$ output of the second D-type flipflop, a second input connected to the clear terminal and an output connected to a set input of the third D-type flipflop.

5. A monostable multivibrator claimed in claim 4 wherein the first logic circuit is composed of a first emitter coupled differential circuit having an input and for generating an output signal in phase with a signal inputted to the input thereof, and the second logic circuit is composed of a second emitter coupled differential circuit having an input connected to one end of the capacitor and for generating the timing defining signal in opposite phase with a signal inputted to the input thereof when the potential of the capacitor reaches a first predetermined reference voltage, and a third logic circuit composed of a third emitter coupled differential circuit having an input connected to the one end of the capacitor and for generating the reset signal in phase with a signal inputted to the input thereof when the potential of the capacitor is higher than a second predetermined reference voltage which is higher than the first predetermined reference voltage.

6. A monostable multivibrator claimed in claim 4 wherein the first logic circuit is composed of a first emitter coupled differential circuit having an input and for generating an output signal in phase with a signal inputted to the input thereof, and the second logic circuit is composed of a Schmitt circuit having an input connected to one end of the capacitor and for generating the timing defining signal in opposite phase with a signal inputted to the input thereof when the potential of the capacitor reaches a first predetermined reference voltage, and a third logic circuit composed of a second emitter coupled differential circuit having an input connected to the one end of the capacitor and for generating the reset signal in phase with a signal inputted to the input thereof when the potential of the capacitor is higher than a second predetermined reference voltage which is higher than the first predetermined reference voltage.

* * * * *